United States Patent [19]
Ngan et al.

[11] Patent Number: 5,759,360
[45] Date of Patent: Jun. 2, 1998

[54] WAFER CLEAN SPUTTERING PROCESS

[75] Inventors: Kenny King-Tai Ngan, Fremont; Jaim Nulman, Palo Alto, both of Calif.

[73] Assignee: Applied Materials, Inc., Santa Clara, Calif.

[21] Appl. No.: 402,676

[22] Filed: Mar. 13, 1995

[51] Int. Cl.$^6$ .................................................. C23C 14/34
[52] U.S. Cl. ................................ 204/192.37; 204/192.35
[58] Field of Search ....................... 204/192.37, 192.35, 204/298.34

[56] References Cited

U.S. PATENT DOCUMENTS

| | | | |
|---|---|---|---|
| 4,025,411 | 5/1977 | Hom-Ma et al. | 204/192.37 |
| 4,298,443 | 11/1981 | Maydan | 204/192.37 X |
| 4,326,911 | 4/1982 | Howard et al. | 156/643 |
| 4,399,116 | 8/1983 | Amouroux et al. | 423/348 |
| 4,412,119 | 10/1983 | Komatsu et al. | 219/121 PF |
| 4,585,517 | 4/1986 | Stemple | 156/643 |
| 4,786,352 | 11/1988 | Benzing | 204/192.37 X |
| 4,786,359 | 11/1988 | Stark et al. | 204/192.37 X |
| 4,844,775 | 7/1989 | Keeble | 204/298.34 X |
| 4,951,601 | 8/1990 | Maydan et al. | 118/719 |
| 5,047,115 | 9/1991 | Charlet et al. | 204/192.37 X |
| 5,449,432 | 9/1995 | Hanawa | 156/643.1 |

FOREIGN PATENT DOCUMENTS

| | | | |
|---|---|---|---|
| 62-021724 | 1/1987 | Japan | C03B 29/00 |
| 5160077 | 6/1993 | Japan | H01L 21/302 |

OTHER PUBLICATIONS

IBM Tech Discl Bulletin, Removal of Contamination Left From Reactive Ion Etching of Si Wafers Without Simultaneous Oxide Growth, vol. 33, No. 5, Oct. 1990.

Salimian et al, "Removal of native silicon oxide with low-energy argon ions", J. Appl. Phys. 70(7) 1 oct. 1991m pp. 3970-3972.

Goto et al, "Independent Control of Ion Density and Ion Bombardment Energy in a Dual RF Excitation Plasma", IEEE Transactions on Semiconductor Mfg. 6(1993) Feb. No. 1, pp. 58-64.

Ruzyllo et al, "Electrical Evaluation of Wet and Dry Cleaning Procedures for Silicon Device Fabrication", J. Electrochm. Soc., 136(1989) May, No. 5, pp. 1474-1476.

Taglauer, "Surface Cleaning Using Sputtering", Appl. Physics A: Solids and Surfaces, A51(1990) Sep. No. 3, pp. 238-251.

*Primary Examiner*—Nam Nguyen
*Attorney, Agent, or Firm*—Donald Verplancken; Birgit E. Morris

[57] ABSTRACT

A method of precleaning a silicon wafer to remove a layer of native silicon oxide thereon comprising adding a mixture of argon and oxygen to a plasma etch chamber including a wafer to be cleaned mounted on a cathode in said chamber, while maintaining the pressure in the chamber below about 3 millitorr. The oxygen is added to react with silicon atoms in the plasma but not with silicon atoms of the single crystal silicon wafer. The presence of oxygen in the plasma at low pressure ensures steady plasma generation and uniform etching across the wafer.

4 Claims, 3 Drawing Sheets

WAFER CLEAN SPUTTERING PROCESS

This invention relates to an improved method of cleaning a silicon wafer. More particularly, this invention relates to an improved method of removing native silicon oxide from a silicon wafer immediately prior to a deposition step.

BACKGROUND OF THE INVENTION

When a layer of material is to be deposited on a silicon wafer, such as a metal layer for example, whether deposited by physical vapor deposition or by chemical vapor deposition, the surface of the silicon wafer must be treated to remove a thin layer, i.e., about 30 angstroms thick, of a native silicon oxide that forms on the wafer after exposure of the wafer to air. If this native oxide layer is not removed, the subsequently deposited film will be contaminated with oxygen, and the deposited film may not adhere well to the silicon surface.

It is convenient to remove the native silicon oxide in a vacuum plasma etch chamber, also called a preclean chamber. A reactive etchant gas, such as a fluorine-containing gas, will also etch away silicon oxide, but the fluorine residues contaminate the chamber walls and the surface of the silicon wafer. The silicon oxide is thus preferably removed by striking a plasma of argon, which acts to etch away the oxide via a sputtering effect immediately prior to the desired deposition. The argon is chemically inert and thus does not contaminate the wafer.

Modern multichamber vacuum processing systems comprise a plurality of cleaning and processing chambers connected to a central wafer transfer chamber, which is also connected to one or more load lock chambers that supply wafers to be processed in the system. Such a system is described for example by Maydan et al in U.S. Pat. No. 4,951,601, incorporated herein by reference. FIG. 1 illustrates a configuration for a system 10 useful herein. An enclosed main housing 12 has sidewalls 13 that define an enclosed vacuum load lock chamber 14. A wafer transfer robot 80 in the wafer transfer chamber 12 brings in a wafer 15 to be processed from an external load lock chamber 26, 28, and transfers the wafer 15 to the preclean chamber 22. Slit valves 38 separate the vacuum load lock chamber 14 from the processing chambers 16, 18, 20 and 22. Each chamber 16, 18, 20 and 22 has an opening 36 which can be sealed by a slit valve 38. After sputter etching in the chamber 22, the wafer 15 is transferred from the preclean chamber 22 to a processing chamber 18, as for the deposition of a metal layer. Additional processing and post deposition chambers 20, 22, can be connected to the vacuum load lock chamber 12. The wafers 15 remain under vacuum at all times, and thus cannot be re-contaminated between processing steps.

Since at very low pressures of below about 3 millitorr (mT) the etch uniformity of a silicon wafer is very good, it is desired to perform the preclean etch step at pressures of 3 mT or less, and preferably at about 1 mT. However, at such low pressures it is very difficult to maintain a plasma in the chamber, since very few gas molecules are present. A plasma can be readily maintained at a pressure of over 4 mT, but the oxide etch uniformity is unacceptably low at such pressures, with about a 15–25% variation in etch uniformity across the wafer.

Nevertheless even after etching at low pressure, over time a buildup of material still occurs on the walls and fixtures of the preclean chamber. We have also noted that over time the efficiency of plasma generation in the chamber decreases.

Thus we sought to improve the efficiency of plasma generation in a preclean chamber, using very low chamber pressures, so as to be able to maintain both good etch uniformity and good efficiency.

SUMMARY OF THE INVENTION

We have found that silicon deposits on the walls of a preclean chamber after sputter etching a native silicon oxide layer from a silicon wafer. It is believed that silicon films on the walls and fixtures of the etch chamber reduces the rf power coupled to the chamber, thereby reducing the efficiency of plasma generation in the chamber. This silicon deposit can be avoided, and a steady plasma at very low chamber pressures can be maintained, when oxygen is added to the argon employed to form the plasma. The oxygen reacts with free sputtered silicon in the chamber to form silicon oxide. A silicon oxide deposit on the walls of the chamber does not reduce the rf power coupled to the plasma etch chamber. Because the RF power coupled to the chamber is not dissipated by a silicon deposit, the cathode bias voltage remains steady and the plasma is not extinguished, even at very low pressures of about 1 mT.

DETAILED DESCRIPTION OF THE INVENTION

Figure 1:
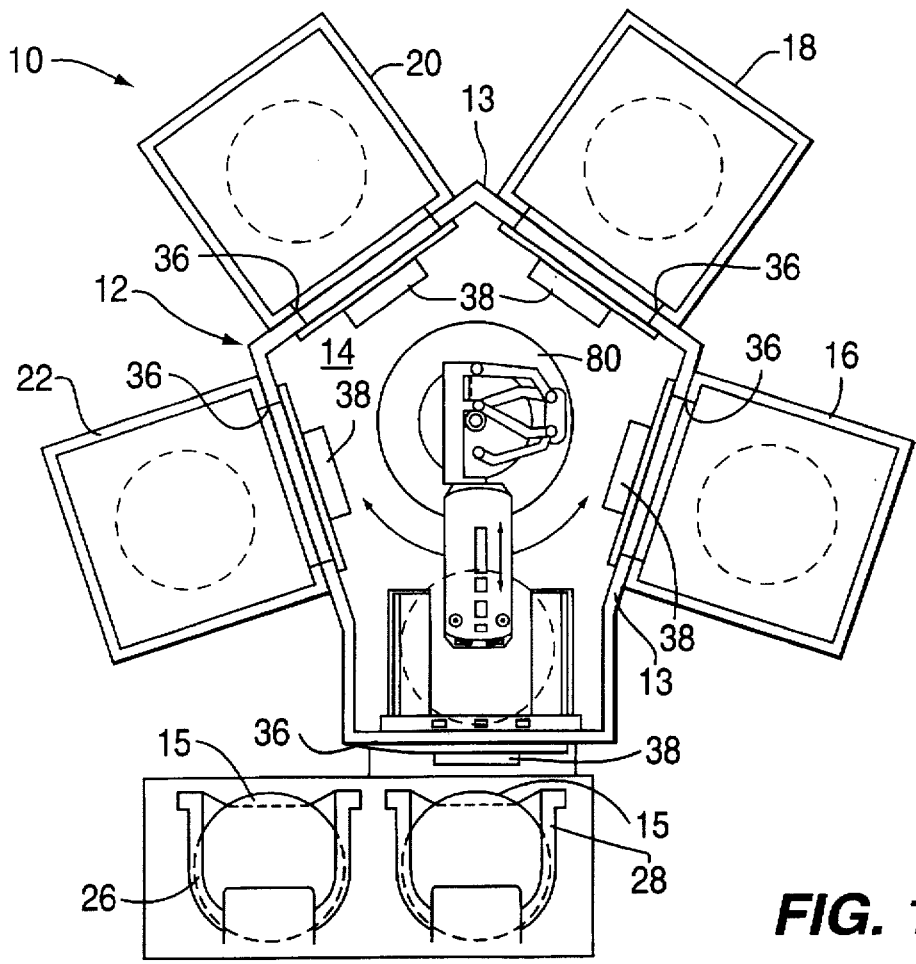
FIG. 1 is a plan view of a vacuum system wherein various chambers for processing semiconductor wafers can be carried out without removing the wafer from a vacuum environment.
Figure 2:
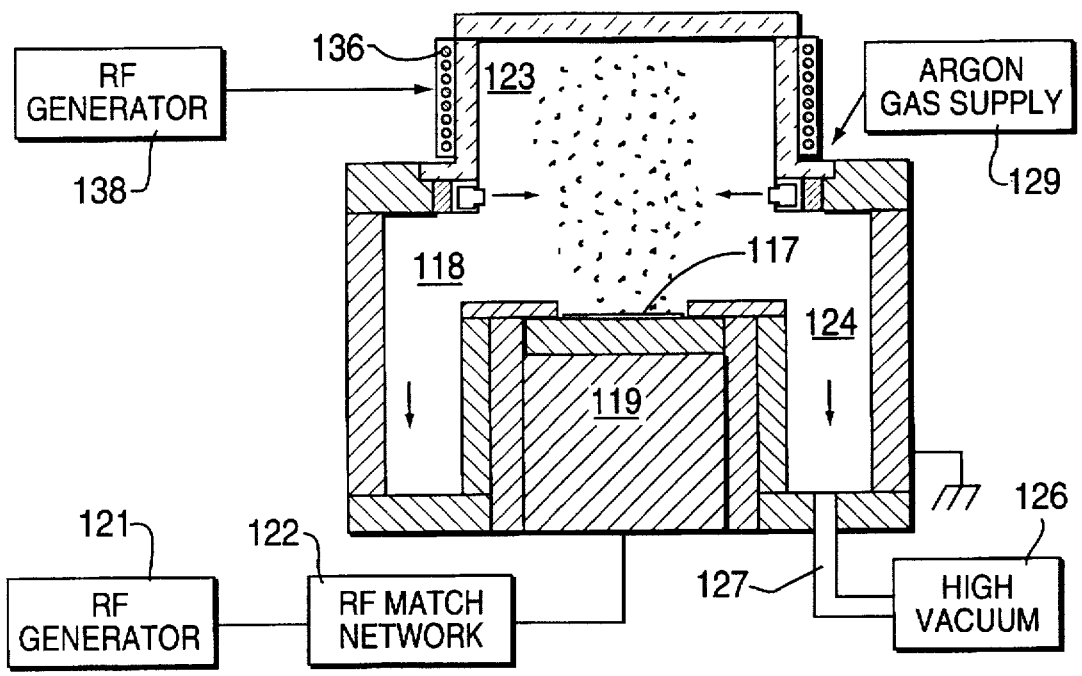
FIG. 2 is a schematic sectional view of a preclean plasma etch chamber suitable for carrying out the present cleaning process.

A plasma etch chamber in which the present preclean etch process can be carried out is shown in FIG. 2. Referring to FIG. 2, a preclean chamber 100 is divided into two sections; a sputtering section 118 in which a wafer 117 to be cleaned is supported on a support electrode 119, and a plasma generation section 123. The chamber 100 has an exhaust channel 124 surrounding the electrode 119, which channel 124 is connected to a high vacuum pump 126 via a valve 127. An argon gas supply 129 feeds into the plasma generation section 123.

There are two sources of power connected to the chamber 100. A first RF generator 121 is connected to the substrate support electrode 119 via an RF match network 122. Suitably it provides RF energy of 13.56 MHz to the support electrode 119. This power source is turned on after a plasma has been ignited in the plasma generation section 123, as described hereinbelow, and serves to attract argon ions generated in the plasma. The argon ions strike the surface of the wafer 117 and sputter remove or etch the native oxide layer thereon.

A second RF generator 138 is for example a 400 KHz power supply connected to a coil 136. This second RF generator 138 provides the power to form a plasma in the plasma generation section 123. This power supply is inductively coupled to the plasma. The role of plasma power is to increase the ion density in the plasma.

At a chamber pressure of about 1 mT, the sputter etch rate is about 300 angstroms per minute. Thus it takes only about 10 seconds to sputter off the native oxide layer on a silicon wafer. However, in order to ensure that all of the oxide is removed, generally sputter etching is continued beyond that point, and a layer of silicon about 100 angstroms thick is also sputter etched. It is this silicon that heretofore has deposited on the walls of the etch chamber.

Some of this material etched from the silicon substrate will be evacuated from the chamber 100 through the exhaust channel 124, but some of it will also deposit on the walls and fixtures within the preclean chamber 100.

When the material deposited on the walls of the etch chamber is silicon oxide, which is a dielectric, it does not interfere with the supply of power to the chamber, and the cathode bias voltage remains constant. However, when silicon is deposited on the chamber walls, the RF power coupling to the plasma is degraded and the DC bias voltage on the cathode drops, which decreases the sputter etch rate. The power dissipation in the silicon is evidenced by a rise in the wall temperature. When the DC bias voltage on the cathode drops too low, the plasma is extinguished, particularly at the very low pressures desired for high sputter etch uniformity.

Thus the addition of oxygen to the argon plasma precursor gas accomplishes two objectives. Firstly, the oxygen in the plasma reacts with sputtered silicon from the substrate to form silicon oxide. Since silicon oxide deposits on the preclean etch chamber walls rather than silicon, and since silicon oxide does not dissipate the electrical power coupled to the chamber, the cathode bias voltage remains constant. Thus the second objective, to maintain the plasma even at very low pressures of 1 mT, is also achieved.

The amount of oxygen added to the argon is not critical, although at least about 5% by volume of oxygen is required to achieve the objectives of the present invention. Since argon is a better sputter gas than oxygen, it is also preferred to have some argon present in the plasma precursor gas. Thus in general from about 5 to about 95% by volume of oxygen in argon is used to form the plasma precursor gas stream.

Generally, if one wishes to remove silicon oxide from the surface of a silicon substrate, it would not be apparent that one could add oxygen to a plasma treatment process, since silicon oxide will be formed which can theoretically re-deposit on the substrate surface. However, because the temperature in the chamber is low during the preclean process, generally about 200°–500° C., silicon and oxygen do not recombine to deposit silicon oxide on the surface, and the sputter etching takes precedence over silicon oxide deposition. Further, since the silicon substrate is a highly bonded, single crystal silicon substrate, which is not highly reactive, the silicon in the substrate does not readily react with oxygen ions in the plasma. Rather, the oxygen ions in the plasma react preferentially with the free silicon atoms or ions present in the plasma. The resultant silicon oxide is either evacuated through the chamber exhaust system, or deposited on nearby walls and fixtures, rather than on the wafer being sputter etched.

The invention will be further described by the following Controls and Example, but the invention is not meant to be limited to the details described therein.

Control A

Figure 3:
FIGS. 3–5 are maps of thickness uniformity across a wafer.

In a preclean chamber as in FIG. 2, the chamber was maintained at a pressure of at least 4 mT, while flowing argon gas into the chamber at a flow rate of about 60 sccm. A six inch silicon wafer was etched to remove about 30 angstroms (Å) of silicon oxide and to perform an overetch of about 100 angstroms of silicon. The etch rate was 220 Å/min. The etch depth varied from 160 Å to 327 Å across the wafer, with a high standard deviation of 19.79%, which is unacceptably high. The thickness variation map is shown in FIG. 3.

EXAMPLE 1

Figure 4:
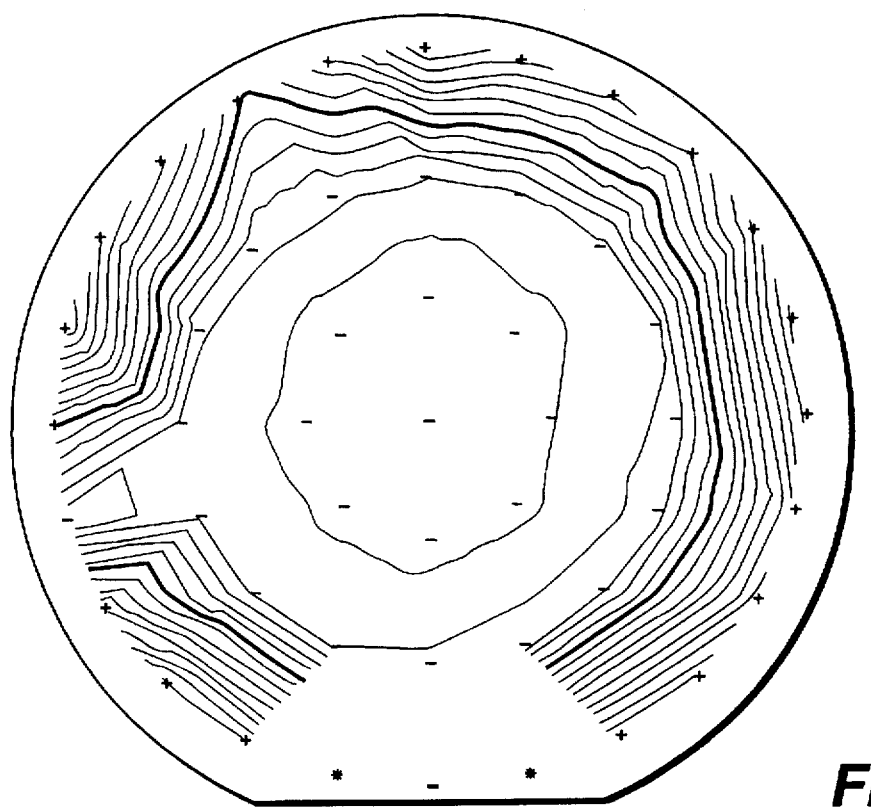

The procedure of Control A was repeated except that the gases fed to the chamber were a mixture of argon, 5 sccm, and oxygen, 3 sccm. The etch rate was 285 Å/min and the thickness variation across the wafer was only 6.2%. The thickness variation map is shown in FIG. 4.

Control B

Figure 5:
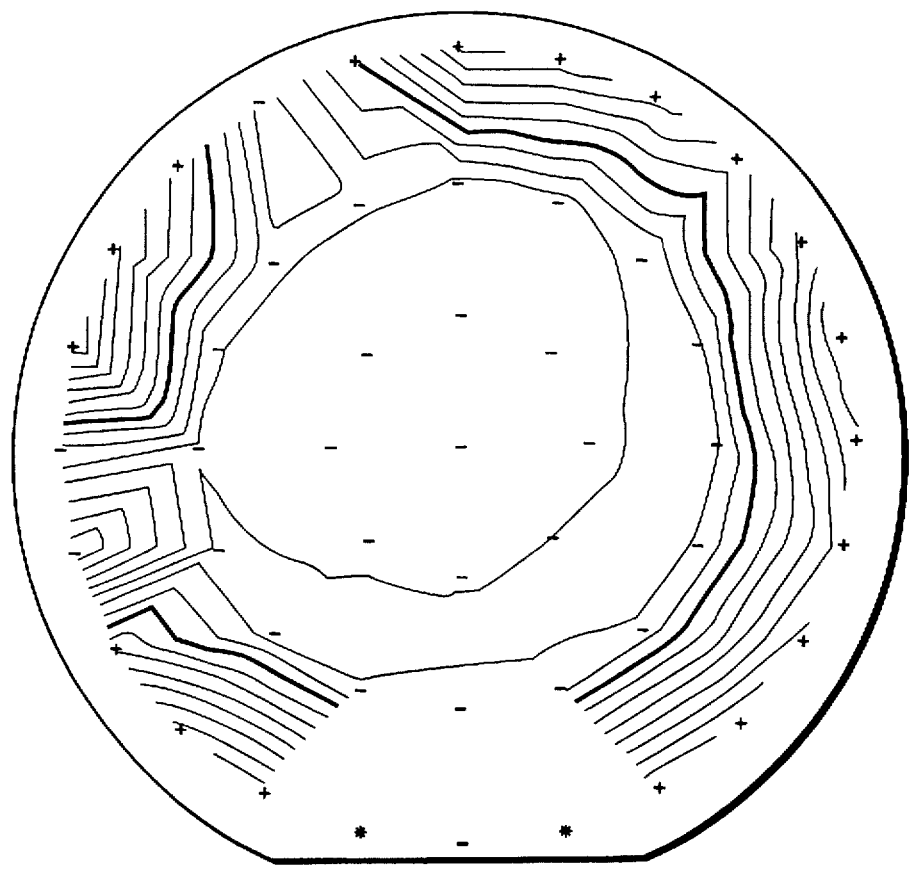

The procedure of Example 1 was repeated except that 5 sccm of argon alone was fed to the chamber. The sputter etch rate was 614 Å/min, but the plasma could not be sustained. The thickness variation map is shown in FIG. 5.

Although the present invention has been described in terms of certain specific embodiments and chambers, other configurations of the vacuum system, preclean chamber, inert gases and oxygen-containing gases can be substituted, as will be evident to one skilled in the art. The invention is only meant to be limited by the scope of the appended claims.

We claim:

1. A method of removing silicon oxide formed on the surface of a silicon wafer caused by exposing the wafer to air comprising:

a) mounting a silicon wafer on the cathode of a vacuum chamber connected to an rf power supply;

b) maintaining the pressure of the chamber below 3 millitorr, c) supplying a mixture of argon and oxygen, said mixture containing at least 5 percent by volume of oxygen as the sole additive to the chamber, and d) forming a plasma thereof in the chamber, whereby the oxygen present in the plasma reacts with sputtered silicon atoms.

2. A method according to claim 1 wherein the temperature of the substrate during sputter etching is below 500° C.

3. A method according to claim 1 wherein the mixture of argon and oxygen contains from about 5 to 95% by volume of oxygen.

4. A method according to claim 1 wherein the plasma is formed by a 400 KHz power supply inductively coupled to a plasma section of said vacuum chamber.

* * * * *